United States Patent
Belot et al.

(10) Patent No.: US 8,115,547 B2
(45) Date of Patent: Feb. 14, 2012

(54) RECONFIGURABLE POWER AMPLIFIER AND USE OF SUCH AMPLIFIER FOR MAKING A MULTI-STANDARD AMPLIFICATION STAGE FOR MOBILE PHONE COMMUNICATIONS

(75) Inventors: Didier Belot, Rives (FR); Yann Deval, Bordeaux (FR); Eric Kerherve, Talence (FR); Nathalie Deltimple, Clairac (FR); Pierre Jarry, Talence (FR)

(73) Assignees: STMicroelectronics S.A., Montrouge (FR); Centre National de la Recherche Scientifique, Paris (FR)

( * ) Notice: Subject to any disclaimer, the term of this patent is extended or adjusted under 35 U.S.C. 154(b) by 41 days.

(21) Appl. No.: 12/523,367

(22) PCT Filed: Jan. 14, 2008

(86) PCT No.: PCT/FR2008/050059
§ 371 (c)(1),
(2), (4) Date: Jul. 16, 2009

(87) PCT Pub. No.: WO2008/099113
PCT Pub. Date: Aug. 21, 2008

(65) Prior Publication Data
US 2010/0109770 A1    May 6, 2010

(30) Foreign Application Priority Data
Jan. 16, 2007 (FR) .................... 07 52699

(51) Int. Cl.
*H03G 3/20* (2006.01)
(52) U.S. Cl. .................. 330/136; 330/310; 330/133
(58) Field of Classification Search ............. 330/136, 330/310, 133
See application file for complete search history.

(56) References Cited

U.S. PATENT DOCUMENTS

| | | | |
|---|---|---|---|
| 6,529,080 B1 * | 3/2003 | Seymour et al. | 330/296 |
| 7,564,311 B2 * | 7/2009 | Rohani et al. | 330/285 |
| 7,688,137 B2 * | 3/2010 | Park et al. | 330/133 |
| 7,768,345 B2 * | 8/2010 | Aoki | 330/133 |
| 2006/0166630 A1 | 7/2006 | Kazakevich et al. | |

FOREIGN PATENT DOCUMENTS

EP    1 526 636    4/2005

* cited by examiner

*Primary Examiner* — Patricia Nguyen
(74) *Attorney, Agent, or Firm* — Gardere Wynne & Sewell, LLP

(57) ABSTRACT

A reconfigurable power amplifier includes at least one amplification circuit (E1, E2), and a circuit (6) for controlling the amplification circuit so as to adapt its operation according to an applied input signal ($RF_{in}$). The circuit for controlling includes a circuit (4, 5) for modifying the compression point of the amplification circuit and for adapting the gain of the amplification circuit in such a manner as to increase the power added efficiency of the circuit for the modified compression point.

35 Claims, 4 Drawing Sheets

| Parameters | GSM | GSM1800 (DSC) | UMTS |
|---|---|---|---|
| Frequency (TX) | 880 / 915 MHz | 1710 / 1785 MHz | 1920 / 1980 MHz |
| Output power max. | 30 dBm (1W) | 27 dBm (500mW) | 24 dBm (250mW) |
| Modulation | GMSK | GMSK | QPSK |

FIG.4
| Ibiasd (mA) | ICP1 (dBm) | OCP1 (dBm) |
|---|---|---|
| 0.1 | 3 | 26.2 |
| 0.74 | 0.5 | 25.5 |
| 1.4 | 0 | 25.4 |
| 2 | -1 | 24.9 |
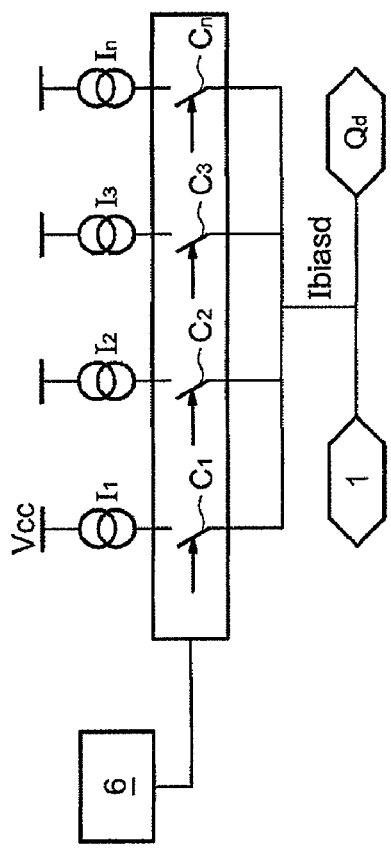
FIG.5
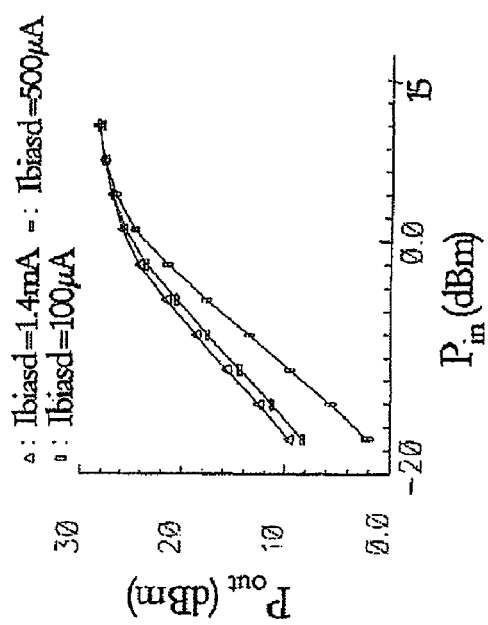
FIG.6

| $P_{in}$ (dBm) | $P_{out}$ (dBm) | PAE (%) Ibiasd=100μA | PAE (%) Ibiasd=1,4μA |
|---|---|---|---|
| -8.4 | 15 | 5.1 | 13 |
| -3 | 20 | 15.6 | 27.1 |

RECONFIGURABLE POWER AMPLIFIER AND USE OF SUCH AMPLIFIER FOR MAKING A MULTI-STANDARD AMPLIFICATION STAGE FOR MOBILE PHONE COMMUNICATIONS

PRIORITY CLAIM

This application is a 371 filing of PCT/FR2008/050059 filed Jan. 14, 2008, which claims the benefit of French Application for Patent No. 07-52699 filed Jan. 16, 2007, the disclosures of which are hereby incorporated by reference.

TECHNICAL FIELD

The invention relates to high-frequency power amplifiers and relates more particularly to reconfigurable power amplifiers.

BACKGROUND

One particularly advantageous application of high-frequency power amplifiers relates to the design of an amplification stage for mobile telephony handsets and, more particularly, the design of multi-standard reconfigurable power amplifiers, in other words amplifiers that are capable of adapting to the specifications of various telecommunications standards.

Thus, for example, such a reconfigurable power amplifier must be capable of operating both according to the UMTS (WCDMA) standards and also to the GSM, DCS or PCS standards.

The notion of reconfigurability indicates that these amplifiers must be capable of dynamically modifying their properties according to the standard being used at a given moment in time, but also according to the power level of an incident signal that is applied to it in order for it to work at an optimum power level.

Indeed, according to certain standards, in particular the GSM and GSM 1800 (DCS) standards, owing to the type of modulation employed, the power of the signals is relatively high, which implies a particular constraint for RF applications.

For this reason, there is a need in the art to provide a power amplifier that is reconfigurable, in particular in terms of power, in order to dynamically respond to the specific constraints that are imposed on it.

SUMMARY

According to a first aspect, a reconfigurable power amplifier comprises at least one amplification circuit and means for controlling the amplification circuit so as to adapt its operation according to an input signal that is applied to it.

According to a general feature of this amplifier, the control means comprise means for modifying the compression point of the amplification circuit and for adapting the gain of the circuit in such a manner as to increase the power added efficiency (PAE) of the circuit for the modified compression point.

Thus, the compression point is made to vary in such a manner as to adapt the linearity of the amplifier according to the operating conditions and the PAE is dynamically modified so as to obtain the maximum PAE at the modified compression point. It has indeed been observed that the efficiency of the amplifier is at maximum for the maximum output power, the efficiency being lower for lower levels of output power.

Adjusting the maximum PAE to the level of the modified compression point thus allows the efficiency of the amplifier to be improved at lower powers.

According to another feature, the control means comprise means for adapting the level of a biasing current applied to the said circuit.

Preferably, the power amplifier is a two-stage amplifier and comprises a first amplification stage and a second amplification stage. The control means then comprise first and second control means for respectively adapting the operation of the first and second stages of amplification.

Thus, for example, the first control means comprise means for adapting the compression point of the first stage.

With regard to the second control means, these advantageously comprise means for adapting the gain of the second stage.

According to another feature, the amplifier also comprises means for modifying the amplification class of the said amplification circuit.

In one embodiment, these means comprise means for modifying the equivalent impedance of an output network of the circuit.

For example, the amplifier thus comprises switching means for selectively connecting a capacitor and an inductor configured in parallel to the output of the circuit.

As far as the means for adapting the level of the biasing current are concerned, in one embodiment, these advantageously comprise an assembly of current sources that may be selectively connected in parallel with one another.

BRIEF DESCRIPTION OF THE DRAWINGS

Other aims, features and advantages of the invention will become apparent upon reading the following description, presented solely by way of non-limiting example and with reference to the appended drawings, in which:

FIG. 4 is a schematic circuit diagram illustrating the generation of the biasing current of the amplification circuits of the amplifier in FIG. 2;

FIGS. 5 and 6 illustrate the variation of the compression point of the first amplification stage of the amplifier in FIG. 2.

DETAILED DESCRIPTION OF THE DRAWINGS

Figures 1, 3:
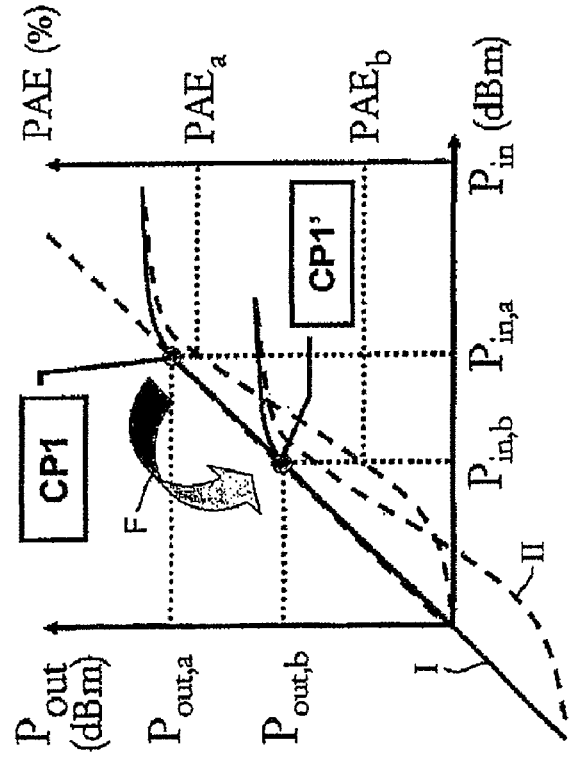
FIG. 1 is a table illustrating the specifications of various telecommunications standards (GSM, DCS and UMTS)
FIG. 3 illustrates the general principle of the dynamic compensation implemented within the amplifier in FIG. 1.

With reference first of all to FIG. 1, a reconfigurable power amplifier must satisfy several demands specific to each telecommunications standard according to which it is designed to operate.

Indeed, the current standards use modulations of different types which implies differences with regards to the forms of the RF signals carried.

By way of an example, the GSM and GSM 1800 (DCS) standards use a modulation of the GMSK (Gaussian Minimum Shift Keying) type, whereas the UMTS standard uses QPSK (Quaternary Phase Shift Keying) modulation.

With regard to the UMTS standard, the transmitted signals have a non-constant envelope, which means that the envelope of the RF signal varies as a function of time. However, it must be preserved in order to avoid the information it contains being altered. It is therefore necessary that the RF amplifiers used for the processing of the signals exhibit a good linearity in order to avoid distortion of the envelope occurring during the amplification. However, the demands in terms of output power are less stringent.

In contrast, with regard to the GSM and GSM 1800 (DCS) standards, depending on the GMSK modulation used, the envelope is relatively constant so that amplification with a very high linearity is not needed. On the other hand, as the table seen in FIG. 1 indicates, the output power must be relatively high. In order to reduce the power consumption, which is a relatively stringent criterion for the fabrication of a reconfigurable power amplifier for mobile telephone handsets, the amplifier must have a high enough operational and power efficiency.

For this reason, sinusoidal classes of operation are generally used, in particular class A, class B or class AB power amplifiers, in the fabrication of power stages for telecommunications equipment designed to operate according to the UMTS standard, owing to their excellent linearity, whereas class F power amplifiers are more often used in the design of power stages for telecommunications equipment operating according to the GSM, DCS or PCS standards.

Figure 2:
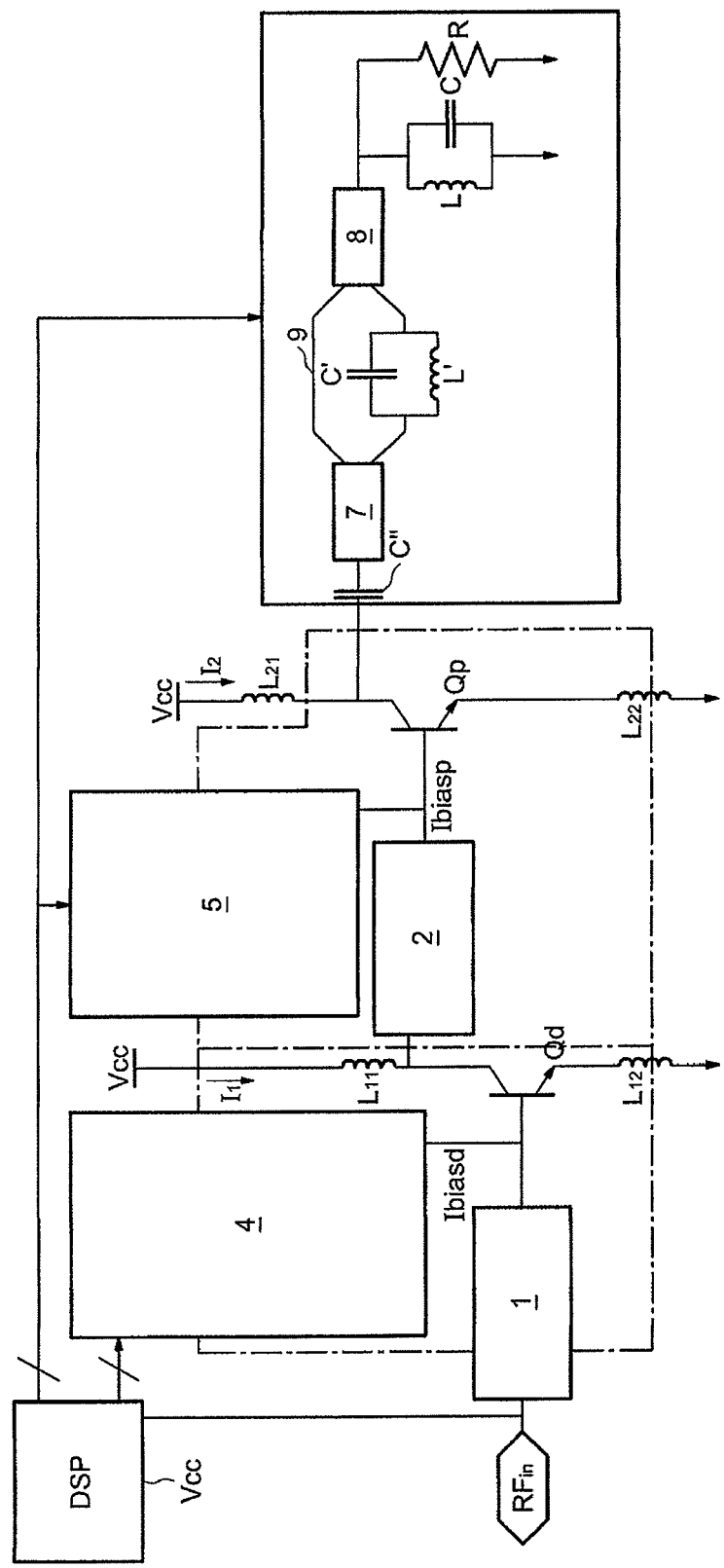
FIG. 2 is a schematic circuit diagram illustrating the general structure of a reconfigurable power amplifier.

In FIG. 2, a reconfigurable power amplifier is shown that is capable of meeting the specific constraints of each standard and, in particular, of favoring either the linearity criterion or the efficiency criterion, depending on the standard used.

As will be detailed in the following part of the description, this high-frequency power amplifier is designed to modify, dynamically, the compression point (CP) of the amplification stage or stages that it comprises and to modify the amplification class of these stages, in order to either improve the linearity of the amplifier or to improve its efficiency.

In the exemplary embodiment shown in FIG. 2, the amplifier comprises two amplification stages E1 and E2, one forming a driver stage (E1) and the other a power stage (E2).

As is conventional, each stage comprises a transistor, $Q_d$ and $Q_p$ respectively. As can be seen, the transistor $Q_d$ of the first stage E1 is associated with two inductors L11 and L12, one connected to a source of DC voltage $V_{CC}$ and the other to ground.

Similarly, the transistor $Q_p$ is associated with two inductors L21 and L22, one connected to the voltage $V_{CC}$ and the other to ground.

The control electrode of the transistor $Q_d$ of the first stage receives a high-frequency signal $RF_{in}$ via an input matching network 1.

The common node between the inductor L11 and the transistor $Q_d$ is connected to the control electrode of the transistor $Q_p$ of the second stage 2 via a conventional inter-stage matching network 2.

The common node between the inductor L21 and the transistor $Q_p$ supplies an amplified signal S via an output network 3 essentially comprising an RLC network.

Furthermore, each stage is equipped with a biasing circuit, 4 and 5 respectively, whose purpose is to bias the transistor $Q_d$ or $Q_p$.

The amplifier is completed by a processing unit 6 receiving, at its input, the signal $RF_{in}$ and driving the biasing circuits 4 and 5 in order to bias the transistors $Q_d$ and $Q_p$ of the amplification stages E1 and E2 as a function of the input signal applied to the amplifier.

More particularly, the first biasing circuit 4 of the first stage E1 is designed to generate a biasing current $I_{biasd}$ intended for the control electrode of the transistor $Q_d$ in order to make its compression point (CP) vary.

The second biasing circuit 5 of the second stage E2 is, for its part, designed to generate a biasing current $I_{biasp}$ intended for the second transistor $Q_p$. In addition, the processing unit 6 acts on the output network 3 in order to modify the class of operation of the power stage by modifying the equivalent impedance of this output network 3.

Thus, according to the amplifier seen in FIG. 2, this essentially amounts to modifying the compression point of the amplifier and the class of operation in order to either improve the linearity, or to improve the power added efficiency (PAE).

This operational parameter PAE is actually formed by the ratio between the added power, in other words the linear difference between the output power and the input power, at a desired RF frequency, over the product of the sum of the currents flowing through each stage and the DC voltage $V_{CC}$.

In other words, the PAE is given, for a two-stage amplifier, by the following equation:

$$PAE = \frac{P_{RF(out)} - P_{RF(in)}}{(I_1 + I_2) \cdot V_{CC}} \qquad (1)$$

in which:

$P_{RF(out)}$ denotes the output power of the amplifier at the RF frequency;

$P_{RF(in)}$ denotes the power of the input signal $RF_{in}$; and $I_1$ and $I_2$ denote the currents flowing through the transistors $Q_d$ and $Q_p$.

As previously indicated, sinusoidal class amplifiers, such as A, B, AB and C class amplifiers, exhibit a good linearity but a relatively low efficiency.

In contrast, switching transistors, of class D, E and F according to which the transistors operate in switching mode, exhibit a poorer linearity but a higher efficiency.

For this reason, in the UMTS standard, a class A amplifier is generally used for the driver stage and a class AB amplifier for the power stage, whereas it is preferable to use a class AB amplifier for the driver stage and a high-efficiency amplifier (class F) for the power stage in the GSM, DCS or PCS standard.

In order to be able make the amplifier operate in multistandard mode, it is desirable to be able to make the class A/class AB configuration switch into class AB/class F.

In the following part of the description, it will thus be considered that this essentially means being able to dynamically make the configuration of a two-stage amplifier switch from the A/AB classes into AB/F class. However, the invention may also be applied, in an analogous manner, to the reconfiguration of power amplifiers operating according to other telecommunications standards.

The architectures of the transistors of the classes AB and F are relatively close. They only essentially differ by their biasing point and their output impedance.

Thus, by acting on the biasing current $I_{biasd}$ and $I_{biasp}$ and by modifying the configuration of the output stage, it is possible to modify the class of operation of each transistor $Q_d$ and $Q_p$.

Referring to FIG. 3, in which the curve I represents the variation of the output power $P_{out}$ as a function of the input power $P_{in}$ and the curve II represents the variation of the PAE as a function of the input power, the amplifier, and in particular the biasing circuit 4 of the first stage E1, modifies the biasing current $I_{biasd}$ of the transistor $Q_d$ in such a manner as to lower the compression point CP1 corresponding to an operating point ($P_{out}$, a; $P_{in}$, a) towards the operating point CP1', corresponding to the operating point ($P_{out}$, b; $P_{in}$, b) as illustrated by the arrow F.

However, as is known per se, the PAE is at maximum for the maximum output power, whereas, for the lower power levels, the efficiency is lower.

Accordingly, the modification of the compression point is combined with a gain compensation in order to adjust the PAE curve so as to obtain a maximum PAE at the compression point CP1' thus modified.

With reference to FIGS. 4 and 5 and to FIG. 6, in which OCP1 and ICP1 respectively denote the output power and the input power at the compression point at 1 dB, as previously indicated, the variation of the compression point is obtained by modifying the biasing current $I_{biasd}$.

For example, the biasing circuit 4 may be formed by a succession of current sources I1, I2, ... I$_n$ arranged in parallel and each associated with a switch C1, C2, C3, ... CN, controlled by the central processing unit 6 as a function of the signal RF$_{in}$, in such a manner as to generate the biasing current $I_{biasd}$ applied to the transistor $Q_d$.

For this purpose, the processing unit 6 is equipped with a detector providing detection of the power level of the input signal RF$_{in}$ in order, for example, to lower the compression point when the input power decreases. Referring to FIG. 5, this can be achieved by increasing or by reducing the biasing current $I_{biasd}$ as a function of the input power level.

Figures 7, 8:
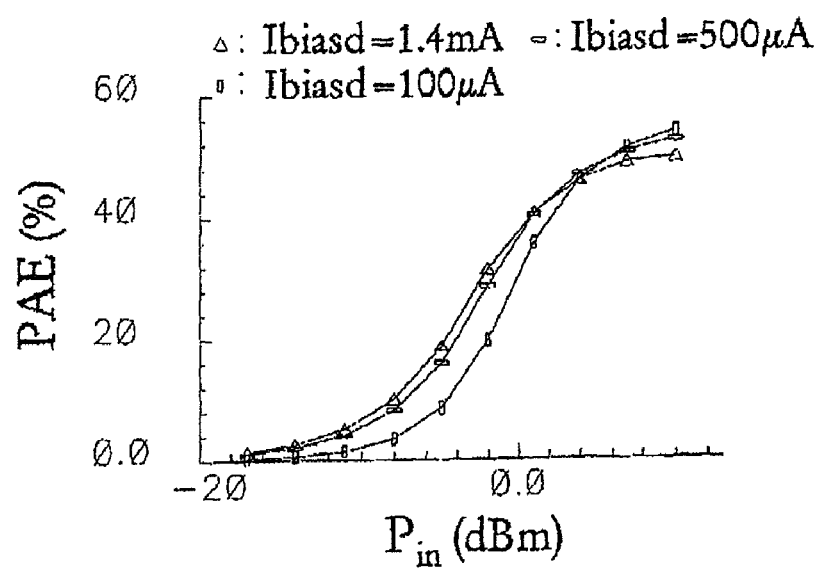
FIGS. 7 and 8 illustrate the variation of the r.m.s. added power of the amplifier in FIG. 2.

Similarly, referring to FIGS. 7 and 8, the PAE can be modified by increasing or by reducing the biasing current $I_{biasd}$.

Referring once again to FIG. 2, the modification in amplification class of the amplifier, and in particular of the second stage E2, is achieved by modifying the equivalent impedance of the output network 3.

Thus, as shown in FIG. 2, the output network 3 of the second stage E2 is equipped with a resonator formed by the parallel association of an inductor L' and of a capacitor C' at the output of the second stage E2 associated with two switches 7 and 8, one, namely the switch denoted by the reference 7, interposed between the second stage E2, with interposition of a decoupling capacitor C" and the resonator L'C', and the other between the resonator L'C' and the output impedance RLC of the output network 3.

The switches 7 and 8 are controlled by the central processing unit 6 in such a manner as to short-circuit the resonator LC via a bypass line 9. The output network 3 can thus be selectively configured, under the control of the central processing unit 6, in such a manner as to configure the power stage 2 either in the form of a class AB transistor or in the form of a class F transistor, for example depending on the power level of the input signal RF$_{in}$ detected.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. Reconfigurable power amplifier, comprising at least one amplification circuit, and means for controlling the amplification circuit so as to adapt its operation according to an input signal that is applied to the amplification circuit, wherein the means for controlling comprise means for modifying a compression point of the amplification circuit and for adapting a gain of the amplification circuit in such a manner as to increase a power added efficiency of the amplification circuit for the modified compression point, and means for modifying a class of operation of the amplification circuit;
wherein the means for modifying the class of operation of the amplification circuit comprise means for modifying an equivalent impedance of an output network of the amplification circuit.

2. Amplifier according to claim 1, wherein the means for controlling comprise means for adapting the level of a biasing current applied to the amplification circuit.

3. Amplifier according to claim 1, further comprising a first amplification stage and a second amplification stage, the means for controlling comprising first and second means for respectively adapting operation of the first and second amplification stages.

4. Amplifier according to claim 3, wherein the first means comprise means for adapting the compression point of the first amplification stage.

5. Amplifier according to claim 3, wherein the second means comprise means for adapting a gain of the second amplification stage.

6. Amplifier, comprising at least one amplification circuit, and means for controlling the amplification circuit so as to adapt its operation according to an input signal that is applied to the amplification circuit, wherein the means for controlling comprise means for modifying a compression point of the amplification circuit and for adapting a gain of the amplification circuit in such a manner as to increase a power added efficiency of the amplification circuit for the modified compression point;
wherein the control means comprise means for adapting the level of a biasing current applied to the amplification circuit; and
wherein the means for adapting the level of the biasing current comprise an assembly of current sources that may be selectively connected in parallel with one another.

7. Amplifier according to claim 6, further comprising means for modifying a class of operation of the amplification circuit.

8. Amplifier according to claim 7, wherein the means for modifying the class of operation of the amplification circuit comprise means for modifying an equivalent impedance of an output network of the amplification circuit.

9. Amplifier according to claim 8, further comprising switching means for selectively connecting a capacitor and an inductor configured in parallel to an output of the amplification circuit.

10. A circuit, comprising:
a first amplifier stage having a first input and a first output, the first input configured to receive a radio frequency signal;
a first biasing circuit configured to bias the first amplifier stage with a first biasing current;
a second amplifier stage having a second input and a second output, the second input coupled to receive a signal from the first output;
a second biasing circuit configured to bias the second amplifier stage with a second biasing current;
a control circuit which is also configured to receive the radio frequency signal, the control circuit configured to control operation of the first biasing circuit to change the first biasing current applied to the first amplifier stage as a function of the received radio frequency signal, the control circuit further configured to control operation of the second biasing circuit to change the second biasing current applied to the second amplifier stage as a function of the received radio frequency signal;

wherein the second amplifier stage includes an output network configured to generate an amplified output signal, the output network having a variable equivalent impedance, the control circuit further configured to control the variable equivalent impedance of the output network as a function of the received radio frequency signal.

11. The circuit of claim 10 wherein the first amplifier stage is a driver stage and the second amplifier stage is a power stage.

12. A circuit comprising:
a first amplifier stage having a first input and a first output, the first input configured to receive a radio frequency signal;
a first biasing circuit operable to bias the first amplifier stage with a first biasing current;
a second amplifier stage having a second input and a second output, the second input coupled to receive a signal from the first output;
a second biasing circuit operable to bias the second amplifier stage with a second biasing current;
a control circuit which is also configured to receive the radio frequency signal, the control circuit operable to control operation of the first biasing circuit to change the first biasing current applied to the first amplifier stage as a function of the received radio frequency signal, the control circuit further operable to control operation of the second biasing circuit to change the second biasing current applied to the second amplifier stage as a function of the received radio frequency signal;
wherein the first amplifier stage is a driver stage and the second amplifier stage is a power stage;
wherein the control circuit is operable to control the first and second biasing circuits to configure the first amplifier stage in Class A mode and the second amplifier stage in Class AB mode if the received radio frequency signal is of a first type, and further operable to control the first and second biasing circuits to configure the first amplifier stage in Class AB mode and the second amplifier stage in Class F mode if the received radio frequency signal is of a second type.

13. The circuit of claim 12 wherein the control circuit is operable to switch the second amplifier stage from Class AB mode to Class F mode by changing a biasing point of the second amplifier stage and changing an output impedance of the second amplifier stage.

14. The circuit of claim 12 wherein the control circuit switches the first amplifier stage from Class A mode to Class AB mode by varying a compression point of the first amplifier stage.

15. A circuit comprising:
a first amplifier stage having a first input and a first output, the first input configured to receive a radio frequency signal;
a first biasing circuit operable to bias the first amplifier stage with a first biasing current;
a second amplifier stage having a second input and a second output, the second input coupled to receive a signal from the first output;
a second biasing circuit operable to bias the second amplifier stage with a second biasing current;
a control circuit which is also configured to receive the radio frequency signal, the control circuit operable to control operation of the first biasing circuit to change the first biasing current applied to the first amplifier stage as a function of the received radio frequency signal, the control circuit further operable to control operation of the second biasing circuit to change the second biasing current applied to the second amplifier stage as a function of the received radio frequency signal;
wherein the first amplifier stage is a driver stage and the second amplifier stage is a power stage;
wherein the control circuit is operable to control the first and second biasing circuits to configure the first amplifier stage in a first sinusoidal class operating mode and the second amplifier stage in a second sinusoidal class operating mode if the received radio frequency signal is of a first type, and further operable to control the first and second biasing circuits to configure the first amplifier stage in a third sinusoidal class operating mode and the second amplifier stage in switching class operating mode if the received radio frequency signal is of a second type.

16. The circuit of claim 15 wherein the second and third sinusoidal class operating modes are the same mode.

17. The circuit of claim 15 wherein the sinusoidal class operating modes are selected from the group consisting of Class A, Class B, Class AB and Class C, and wherein the switching class operating modes are selected from the group consisting of Class D, Class E and Class F.

18. The circuit of claim 15 wherein the second amplifier stage includes an output network configured to generate an amplified output signal, the output network having a variable equivalent impedance, the control circuit further operable to control the variable equivalent impedance of the output network as a function of the received radio frequency signal.

19. The circuit of claim 10 wherein the output network is an RLC network.

20. A circuit, comprising:
a first amplifier stage having a first input and a first output, the first input configured to receive an input signal;
a first biasing circuit configured to bias the first amplifier stage with a first biasing current, the first biasing circuit varying the first biasing current as a function of input power of the received input signal so as to lower a compression point of the first amplifier stage when input power decreases;
a second amplifier stage having a second input and a second output, the second input coupled to receive a signal from the first output;
a second biasing circuit configured to bias the second amplifier stage with a second biasing current, the second biasing circuit varying the second biasing current as a function of input power of the received input signal so as to vary a power added efficiency of the second amplifier stage;
wherein the second amplifier stage includes an output network, an equivalent impedance of the output network being selectively modified as a function of input power of the received input signal so as to change an amplification class of the second amplifier stage.

21. The circuit of claim 20 further comprising a control circuit which is also configured to receive the input signal, the control circuit operable to control operation of the first biasing circuit to vary the first biasing current applied to the first amplifier stage and control operation of the second biasing circuit to vary the second biasing current applied to the second amplifier stage.

22. A circuit comprising:
a first amplifier stage having a first input and a first output, the first input configured to receive an input signal;
a first biasing circuit operable to bias the first amplifier stage with a first biasing current, the first biasing circuit varying the first biasing current as a function of input power of the received input signal so as to lower a compression point of the first amplifier stage when input power decreases;

a second amplifier stage having a second input and a second output, the second input coupled to receive a signal from the first output;

a second biasing circuit operable to bias the second amplifier stage with a second biasing current, the second biasing circuit varying the second biasing current as a function of input power of the received input signal so as to vary a power added efficiency of the second amplifier stage;

wherein the second amplifier stage includes an output network, a circuit configuration of the output network being selectively modified as a function of input power of the received input signal so as to change an amplification class of the second amplifier stage.

23. The circuit of claim 22 further comprising a control circuit which is also configured to receive the input signal, the control circuit operable to control controlling operation of the first biasing circuit to vary the first biasing current applied to the first amplifier stage, control operation of the second biasing circuit to vary the second biasing current applied to the second amplifier stage and control the circuit configuration of the output network.

24. The circuit of claim 22 wherein the output network includes a resonator circuit, the resonator circuit being selectively short-circuited as a function of input power of the received input signal.

25. The circuit of claim 24 wherein short-circuiting the resonator circuit changes the second amplifier stage from a sinusoidal class operating mode to a switching class operating mode.

26. The circuit of claim 22 wherein the second amplifier stage includes an output network, an equivalent impedance of the output network being selectively modified as a function of input power of the received input signal so as to change an amplification class of the second amplifier stage.

27. A reconfigurable power amplifier, comprising:
    at least one amplification circuit including an output network;
    a control circuit operable to control the amplification circuit so as to adapt its operation according to an input signal that is applied to the amplification circuit;
    wherein the control circuit comprises a first circuit operable to modify a compression point of the amplification circuit and adapt a gain of the amplification circuit in such a manner as to increase a power added efficiency of the amplification circuit for the modified compression point, and a second circuit operable to modify a class of operation of the amplification circuit by modifying an equivalent impedance of said output network of the amplification circuit.

28. The amplifier according to claim 27, wherein the control circuit is operable to adapt a level of a biasing current applied to the amplification circuit.

29. The amplifier according to claim 27, wherein the amplification circuit comprises a first amplification stage and a second amplification stage, and wherein the control circuit is operable to adapt operation of the first and second amplification stages.

30. The amplifier according to claim 29, wherein the first circuit is operable to adapt the compression point of the first amplification stage.

31. Amplifier according to claim 29, wherein the first circuit is operable to adapt a gain of the second amplification stage.

32. A reconfigurable power amplifier, comprising:
    at least one amplification circuit including an output network;
    a control circuit operable to control the amplification circuit so as to adapt its operation according to an input signal that is applied to the amplification circuit;
    wherein the control circuit is operable to modify a compression point of the amplification circuit and adapt a gain of the amplification circuit in such a manner as to increase a power added efficiency of the amplification circuit for the modified compression point, said control circuit being operable to adapt a level of a biasing current applied to the amplification circuit by selectively connecting ones of an assembly of current sources in parallel with one another.

33. The amplifier according to claim 32, wherein the control circuit is further operable to modify a class of operation of the amplification circuit.

34. The amplifier according to claim 33, wherein modification of the class of operation of the amplification circuit is effectuated by the control circuit modifying an equivalent impedance of said output network of the amplification circuit.

35. The amplifier according to claim 34, further comprising a switching circuit operable to selectively connect a capacitor and an inductor configured in parallel to an output of the amplification circuit.

* * * * *